(12) United States Patent
Brungard et al.

(10) Patent No.: US 10,741,945 B2
(45) Date of Patent: Aug. 11, 2020

(54) REPLACEMENT ELECTRICAL CONNECTORS

(71) Applicant: FCI USA LLC, Etters, PA (US)

(72) Inventors: Thomas Brungard, York, PA (US);
Michael Percherke, Enola, PA (US);
Christopher J. Kolivoski, Lewisberry, PA (US); Christopher S. Gieski, Gardners, PA (US); Nazareth Eppley, Camp Hill, PA (US); Charles Copper, Hummelstown, PA (US); Thierry Goossens, Herdersem (BE)

(73) Assignee: FCI USA LLC, Etters, PA (US)

( * ) Notice: Subject to any disclaimer, the term of this patent is extended or adjusted under 35 U.S.C. 154(b) by 0 days.

(21) Appl. No.: 14/452,270

(22) Filed: Aug. 5, 2014

(65) Prior Publication Data
US 2015/0056833 A1    Feb. 26, 2015

Related U.S. Application Data

(60) Provisional application No. 61/870,060, filed on Aug. 26, 2013.

(51) Int. Cl.
*H01R 12/70* (2011.01)
*H01R 13/11* (2006.01)
*H01R 12/58* (2011.01)
*H01R 13/41* (2006.01)
(Continued)

(52) U.S. Cl.
CPC ....... *H01R 12/7088* (2013.01); *H01R 12/585* (2013.01); *H01R 13/113* (2013.01); *H01R 13/41* (2013.01); *H05K 1/116* (2013.01); *H05K 3/306* (2013.01); *H05K 2201/0979* (2013.01); *H05K 2201/09609* (2013.01); *H05K 2201/10189* (2013.01); *Y10T 29/49147* (2015.01)

(58) Field of Classification Search
CPC ......... H01R 12/585; H01R 12/7088; H01R 13/113; H01R 13/41; H05K 1/116; H05K 3/306; H05K 2201/09609; H05K 2201/0979; H05K 2201/10189
USPC .............................. 439/79, 80, 108
See application file for complete search history.

(56) References Cited

U.S. PATENT DOCUMENTS

| | | | |
|---|---|---|---|
| 4,790,763 A * | 12/1988 | Weber | H01R 23/68 439/65 |
| 6,379,188 B1 | 4/2002 | Cohen et al. | |
| 6,498,708 B2 | 12/2002 | Schilloff et al. | |

(Continued)

FOREIGN PATENT DOCUMENTS

| | | |
|---|---|---|
| CN | 1619889 A | 5/2005 |
| CN | 202888442 U | 4/2013 |

OTHER PUBLICATIONS

Chinese Office Action for Chinese Application No. 201410420951.4 dated Dec. 19, 2017.

(Continued)

*Primary Examiner* — Amy Cohen Johnson
*Assistant Examiner* — Paul D Baillargeon
(74) *Attorney, Agent, or Firm* — Wolf, Greenfield & Sacks, P.C.

(57) ABSTRACT

In accordance with one embodiment, an electrical connector can be mounted to a first printed circuit board to obtain a first current capacity, and the electrical connector can be mounted to a second printed circuit board to obtain a second current capacity that is lower than the first current capacity.

27 Claims, 6 Drawing Sheets

(51) Int. Cl.
*H05K 3/30* (2006.01)
*H05K 1/11* (2006.01)

(56) References Cited

U.S. PATENT DOCUMENTS

| | | | |
|---|---|---|---|
| 6,563,056 B1 | 5/2003 | Belwon et al. | |
| 6,835,103 B2 * | 12/2004 | Middlehurst | H01R 13/113 439/699.1 |
| 7,001,189 B1 | 2/2006 | McGowan et al. | |
| 7,139,177 B2 | 11/2006 | Gottlieb | |
| 7,344,395 B2 | 3/2008 | Agethen et al. | |
| 7,497,731 B2 | 3/2009 | Rosenfeldt et al. | |
| 7,666,025 B2 * | 2/2010 | Cheng | H01R 12/7088 439/374 |
| 7,976,317 B2 | 7/2011 | Patel et al. | |
| 8,182,289 B2 | 5/2012 | Stokoe et al. | |
| 8,187,017 B2 * | 5/2012 | Daily | H01R 13/113 439/290 |
| RE44,556 E * | 10/2013 | Minich | H01R 12/727 439/79 |
| 2003/0147221 A1 | 8/2003 | Blasko et al. | |
| 2005/0208791 A1 | 9/2005 | Xie et al. | |
| 2009/0017647 A1 | 1/2009 | Horiuchi | |
| 2010/0184339 A1 * | 7/2010 | Ngo | H01R 12/7088 439/682 |
| 2010/0330846 A1 * | 12/2010 | Ngo | H01R 12/724 439/660 |
| 2011/0212649 A1 | 9/2011 | Stokoe et al. | |
| 2012/0045915 A1 | 2/2012 | Daily et al. | |
| 2012/0060946 A1 | 3/2012 | De Carolis et al. | |
| 2012/0262895 A1 | 10/2012 | Quek | |
| 2012/0289071 A1 * | 11/2012 | Dodds | H01R 12/724 439/183 |
| 2014/0308850 A1 * | 10/2014 | Song | H01R 4/2404 439/620.15 |

OTHER PUBLICATIONS

Extended European Search Report for European Application No. 14839711.0 dated Mar. 27, 2017.
Taiwanese Office Action for Taiwanese Application No. 103128167 dated Dec. 27, 2018.

* cited by examiner

US 10,741,945 B2

REPLACEMENT ELECTRICAL CONNECTORS

CROSS REFERENCE TO RELATED APPLICATIONS

This application claims the benefit of U.S. Provisional Patent Application Ser. No. 61/870,060, filed Aug. 26, 2013, the disclosure of which is hereby incorporated by reference as if set forth in its entirety herein.

BACKGROUND

Electrical connectors used to transmit data signals and/or electrical power, such as alternating current (AC) power and/or direct current (DC) power, may include a plurality of power contacts and a plurality of signal contacts mounted in an electrically-insulative housing. In a typical application, the connector may be configured to be mounted onto a printed circuit board, such as a printed circuit board, and configured to mate with a complementary electrical component, which can be a power cable or complementary electrical connector, for example. Specifically, each contact within the housing may include one or more header and/or receptacle contacts that mate with opposed receptacle and/or header contacts, respectively, of the complementary electrical component.

SUMMARY

In accordance with one embodiment, an electrical connector can be mounted to a first printed circuit board to obtain a first current capacity, and the electrical connector can be mounted to a second printed circuit board to obtain a second current capacity that is lower than the first current capacity. In accordance with another embodiment, an electrical connector family includes a plurality of related electrical connectors. The family can include a first electrical connector comprising an electrically insulative first connector housing and a power contact or contacts supported by the connector housing. The power contact or contacts can define first and second parallel columns of mounting terminals that are each configured to be electrically connected to a bussed power pad of a printed circuit board. The bussed power pad can include first and second parallel columns of through holes that are configured to receive the first and second parallel columns of mounting terminals, respectively. The electrical connector family can further include a second electrical connector that is a drop-in replacement for the first electrical connector. The second electrical connector can include an electrically insulative second connector housing and a power contact supported by the second connector housing. The power contact can define a column of mounting terminals such that one of the first and second columns of through holes do not receive mounting terminals when the second electrical connector is mounted to the printed circuit board.

DETAILED DESCRIPTION

Figure 1:
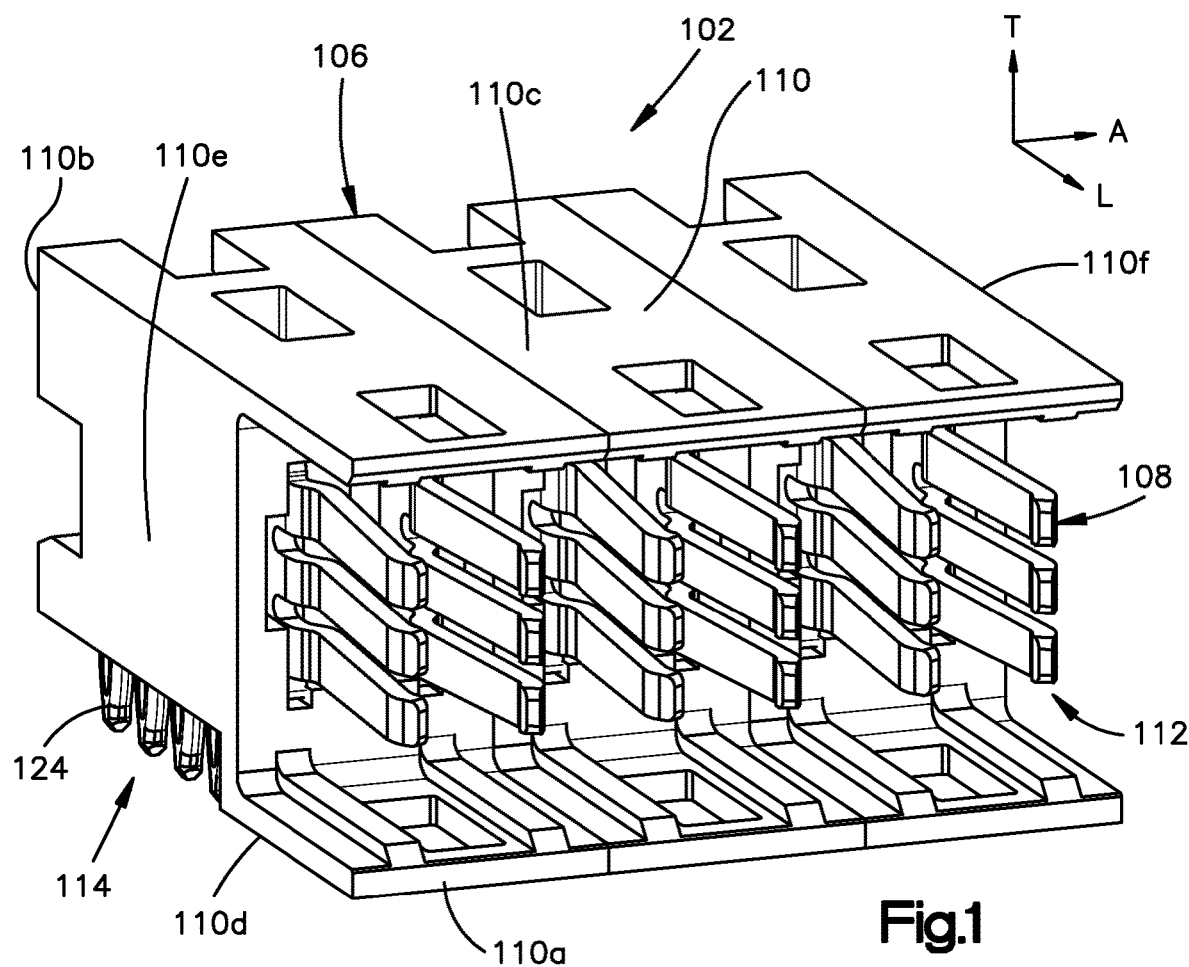
FIG. 1 is a perspective view of an electrical connector including connector housings and power contacts supported by the connector housings constructed in accordance with one embodiment, wherein the electrical connector is configured to be mated with a complementary electrical connector and mounted to an underlying printed circuit board.

For convenience, the same or equivalent elements in the various embodiments illustrated in the drawings have been identified with the same reference numerals. Certain terminology is used in the following description for convenience only and is not limiting. The words "left," "right," "front," "rear," "upper," and "lower" designate directions in the drawings to which reference is made. The words "forward," "forwardly," "rearward," "inner," "inward," "inwardly," "outer," "outward," "outwardly," "upward," "upwardly," "downward," and "downwardly" refer to directions toward and away from, respectively, the geometric center of the object referred to and designated parts thereof. The terminology intended to be non-limiting includes the above-listed words, derivatives thereof and words of similar import.

Referring initially to FIGS. 1-8B, in accordance with one embodiment, a first electrical connector 102 can be configured so that it can be mounted to a plurality of electrical components, for instance a bussed printed circuit board 104*a* or a non-bussed printed circuit board 104*b*. A first electrical connector assembly can include the electrical connector 102 mounted to a printed circuit board, for instance the printed circuit board 104*a* or the printed circuit board 104*b*. The electrical connector 102 can be mated along a mating direction with a complementary electrical connector, for instance a complementary electrical connector 202. The complementary electrical connector 202 can be configured to be mounted to an electrical component, such as the bussed and non-bussed printed circuit boards 104*a* and 104*b*, respectively. A second electrical connector assembly can include the complementary electrical connector 202 mounted to a printed circuit board, for instance the printed circuit board 104a or the printed circuit board 104b. The first and second electrical connector assemblies, and thus the electrical connectors 102 and 202, can be configured to be mated with each other so as to establish an electrical connection, for instance an electrical connection that transfers power, between the electrical connectors 102 and 202.

Figure 2:
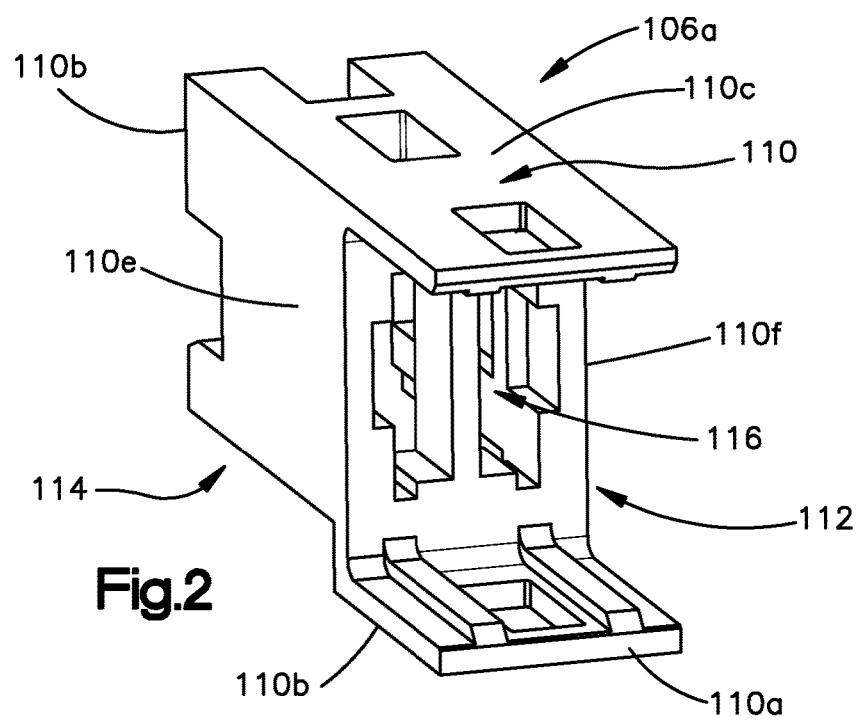
FIG. 2 is perspective view of one of the connector housings shown in FIG. 1.
Figure 3:
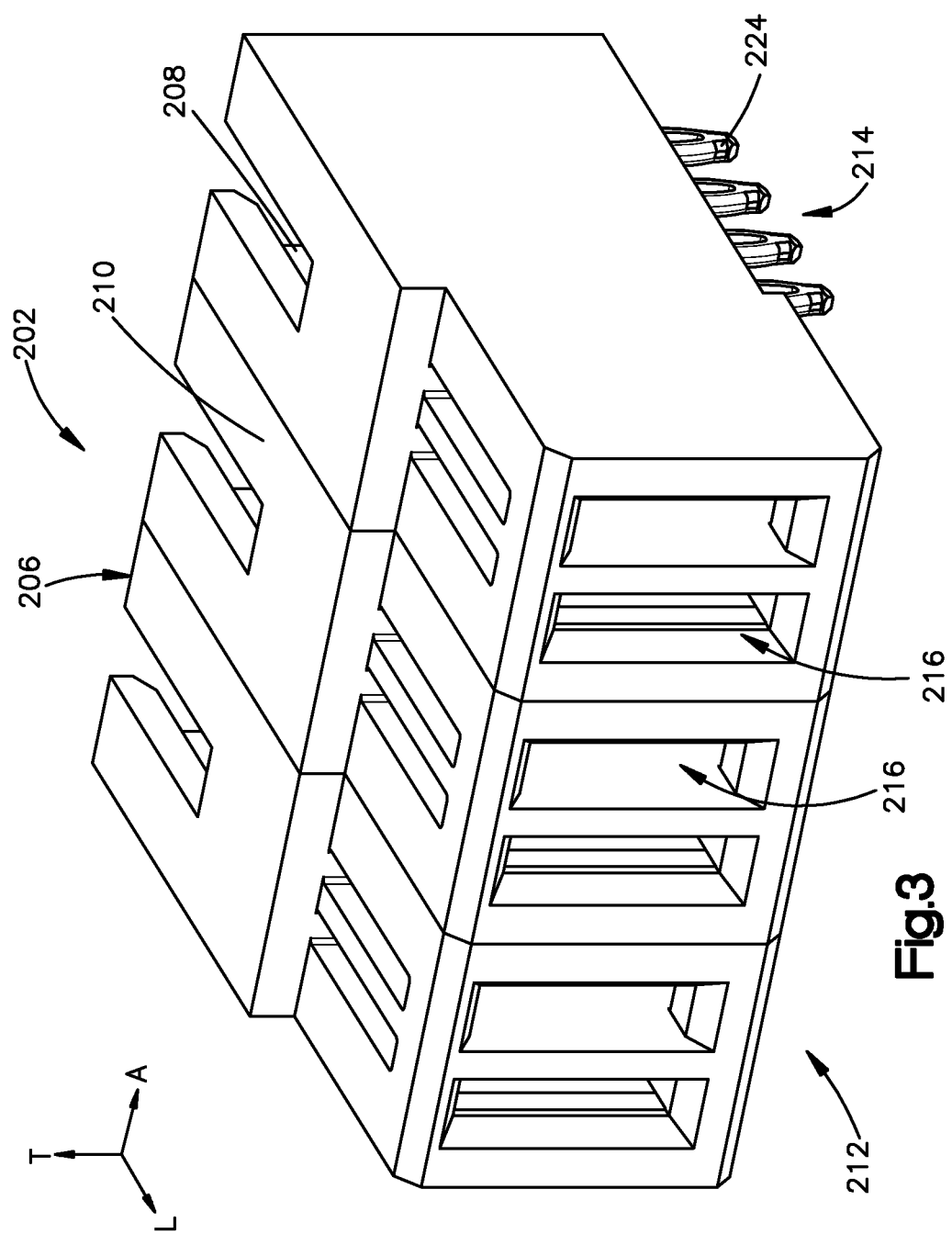
FIG. 3 is a perspective view another electrical connector constructed in accordance with another embodiment, wherein the electrical connector shown in FIG. 3 can be mated with the electrical connector shown in FIG. 1.

Referring in particular to FIGS. 1-3, the electrical connector 102 can include a first dielectric or electrically insulative connector housing 106 and at least one power contact 108, for instance a plurality of power contacts 108, that are at least partially disposed within the connector housing 106. As is clearly shown in FIG. 1, power contacts 108 may be arranged such that a first portion (half in FIG. 1) of the power contacts 108 have contact surfaces facing in one direction (e.g. direction A in FIG. 1) and a second portion of the power contacts 108 have contact surfaces facing in the opposite direction. In the embodiment of FIG. 1, the power contacts 108 are arranged in pairs, with each power contact in the pair being a mirror image of the other. This configuration results in the normal force associated with each contact within the pair canceling out the normal force associated with the other contact within the pair. As is clearly shown on page 7 of Appendix A of U.S. Provisional Patent Application Ser. No. 61/870,060, filed Aug. 26, 2013, in some embodiments the distance between the center lines of adjacent power contact pairs may be 7 millimeters. Referring to FIG. 2, the connector housing 106 can include a plurality of connector housings 106a that are attached to each other, or the connector housings 106a can be monolithic with respect to each other. It will be understood that the connector housing 106 can include any number of connector housings 106a, and thus can support any number of power contacts 108, as desired. The power contacts 108 can be configured to transmit electrical current. As is clearly shown on pages 2, 3 and 5 of Appendix B of U.S. Provisional Patent Application Ser. No. 61/870,060, filed Aug. 26, 2013, when mounted on a substrate, the top of connector housing 106 is less than 10 millimeters above the substrate. In accordance with the illustrated embodiment, when the electrical connector 102 is mounted to either of the printed circuit boards 104a and 104b along a mounting direction, the power contacts 108 are placed in electrical communication with respective electrical traces of the printed circuit boards 104a and 104b. The complementary electrical connector 202 can include a second or complementary dielectric or electrically insulative connector housing 206 and at least one second or complementary power contact 208, for instance a plurality of second or complementary power contacts 208 that are supported by the complementary connector housing 206. When the complementary electrical connector 202 is mounted to the either of the printed circuit boards 104 a and 104 b, the power contacts 208 are placed in electrical communication with the respective electrical traces of the printed circuit boards 104a and 104b. The electrical connector 102 can be configured to mate with the complementary electrical connector 202 along the mating direction so as to establish an electrical connection between the first and second power contacts 108 and 208, respectively.

The electrical connector 102 can be constructed as a right-angle plug or header connector that includes the connector housing 106. The connector housing 106 includes a first housing body 110 that defines a first mating interface 112 and a first mounting interface 114 which are oriented substantially perpendicular with respect to each other so as to define the right-angle electrical connector 102. It will be understood that the electrical connector 102 can be constructed as desired, for instance as a vertical connector such that the mating interface 112 is parallel to the mounting interface 114. In accordance with the illustrated embodiment, the complementary electrical connector 202 can be constructed as a right-angle receptacle connector that defines a complementary mating interface 212 and a complementary mounting interface 214 that extends substantially perpendicular to the complementary mating interface 212. The mating interface 112 of the electrical connector 102 can be configured to mate with the complementary mating interface 212 of the complementary electrical connector 202. The first and complementary mounting interfaces 114 and 214, respectively, can be configured to mount onto underlying printed circuit boards, such as the printed circuit boards 104a and 104b. The mating interface 112 of the electrical connector 102 can include openings 116 that are defined by the connector housing 106. The power contacts 108 can be disposed in the openings 116. The mating interface 212 of the complementary electrical connector 212 can include receptacle openings 216 such that the power contacts 108 of the electrical connector 102 can be received in the receptacle openings 216 when the electrical connector 102 is mated with the complementary electrical connector 202. It will be understood that the receptacle openings 216 can be sized so as to receive any number of power contacts as desired. It will further be understood that the receptacle openings 216 can be sized so as to received power contacts constructed in various configurations and sizes as desired.

As shown in the illustrated embodiment, the electrical connector 102 can be configured as a header connector and the complementary electrical connector 202 can be configured as a receptacle connector, such that the connector housing 206 is configured to receive the electrical connector 102 so as to mate the first and complementary electrical connectors 102 and 202, respectively, with each other.

Various structures are described herein as extending horizontally along a first or longitudinal direction "L" and a second or lateral direction "A" that is substantially perpendicular to the longitudinal direction L, and vertically along a third or transverse direction "T" that is substantially perpendicular to the longitudinal and lateral directions L and A, respectively. As illustrated in FIG. 1, the longitudinal direction "L" extends along a forward/rearward direction of the electrical connector 102, and defines the mating direction along which one or both of the electrical connector 102 and the complementary electrical connector 202 are moved relative to the other so as to mate the electrical connector 102 with the complementary electrical connector 202. For instance, the mating direction of the illustrated electrical connector 102 can be in a forward direction along the longitudinal direction L, and the electrical connector 102 can be unmated from the complementary electrical connector 202 by moving the electrical connector 102 in an opposed longitudinally rearward direction relative to the complementary electrical connector 202. As illustrated, the electrical connector 102 can be moved relative to the printed circuit boards 104a and 104b along the transverse direction T that defines the mounting direction, and the lateral direction "A" extends along a width of the electrical connector 102.

Thus, unless otherwise specified herein, the terms "lateral," "longitudinal," and "transverse" are used to describe the orthogonal directional components of various components. The terms "inboard" and "inner," and "outboard" and "outer" and like terms when used with respect to a specified directional component are intended to refer to directions along the directional component toward and away from the center of the apparatus being described. It should be appreciated that while the longitudinal and lateral directions are illustrated as extending along a horizontal plane, and that while the transverse direction is illustrated as extending along a vertical plane, the planes that encompass the various directions may differ during use, depending, for instance, on the orientation of the various components. Accordingly, the directional terms "vertical" and "horizontal" are used to describe the first and second electrical connector assemblies and their components as illustrated merely for the purposes of clarity and convenience, it being appreciated that these orientations may change during use.

With reference to FIGS. 1-5, in accordance with the illustrated embodiment, the housing body 110, and thus the connector housing 106, defines a front end 110a and an opposed rear end 110b that is spaced from the front end 110a along the longitudinal direction L. The front end 110a can generally lie in a plane defined by the transverse and lateral directions T and A, respectively. The front end 110a can define the mating interface 112 that is configured to be mated with the complementary electrical connector 202 so as to place the electrical connector 102 in electrical communication with the complementary electrical connector 202. The housing body 110, and thus the connector housing 106, can further include a top end 110c and an opposed bottom end 110d that is spaced from the top end 110c along the transverse direction T. For instance, the top end 110c can be spaced from the bottom end 110d in an upward direction that is substantially parallel to the transverse direction T. Thus, the bottom end 110d can be spaced from the top end 110c in a downward direction that is substantially parallel to the transverse direction T. The top end 110c can extend from the front end 110a to the rear end 110b. The bottom end 110d can define the mounting interface 114 that is configured to be mounted to the printed circuit board 104. The bottom end 110d can generally lie in a plane defined by the longitudinal and lateral directions L and A, respectively. The connector housing 106, and thus the electrical connector 102, can further include first and second opposed sides 110e and 110f, respectively, that are spaced from each other along the lateral direction A. While the lateral and longitudinal directions A and L, respectively, extend horizontally and the transverse direction T extends vertically in accordance with the illustrated orientation of the electrical connector 102, it should be appreciated that the orientation of the electrical connector 102 can vary as desired.

Figure 6A:
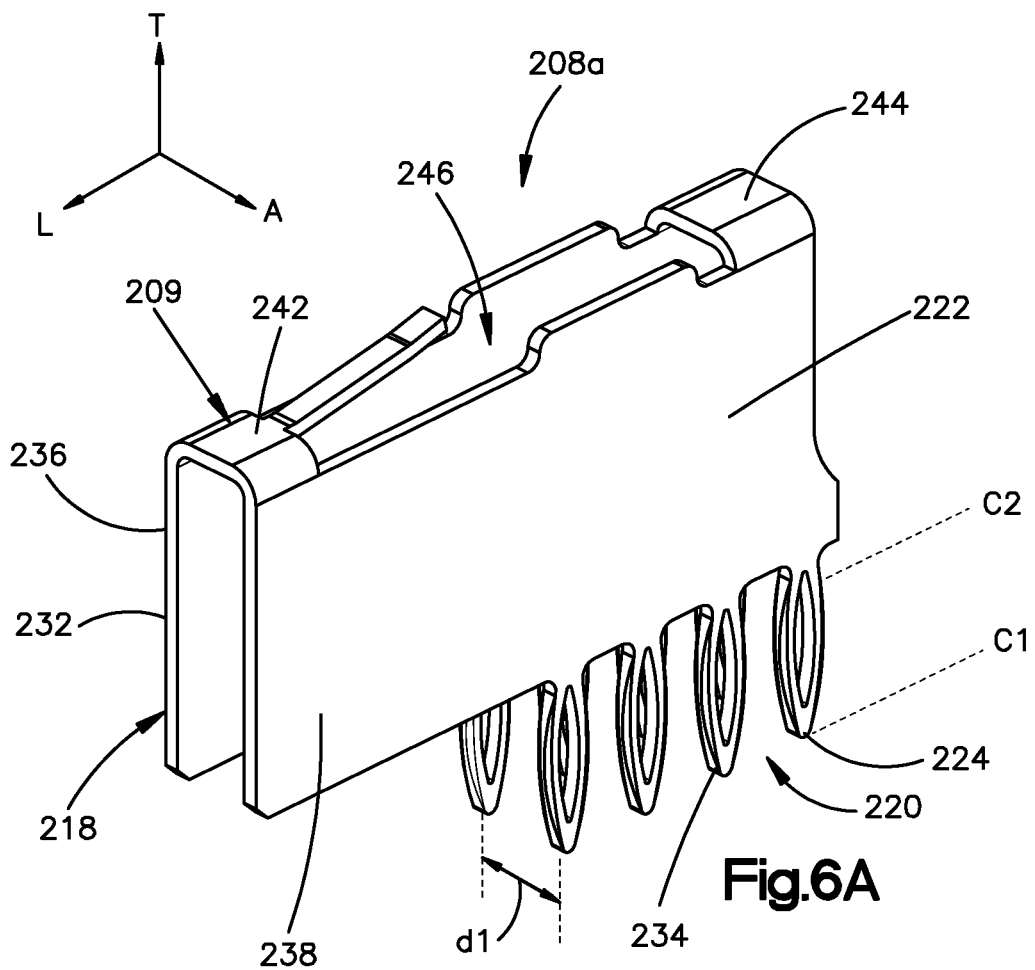
FIG. 6A is a perspective view of a bussed power contact that can be included as part of the electrical connector shown in FIG. 3 in accordance with one embodiment.
Figure 6B:
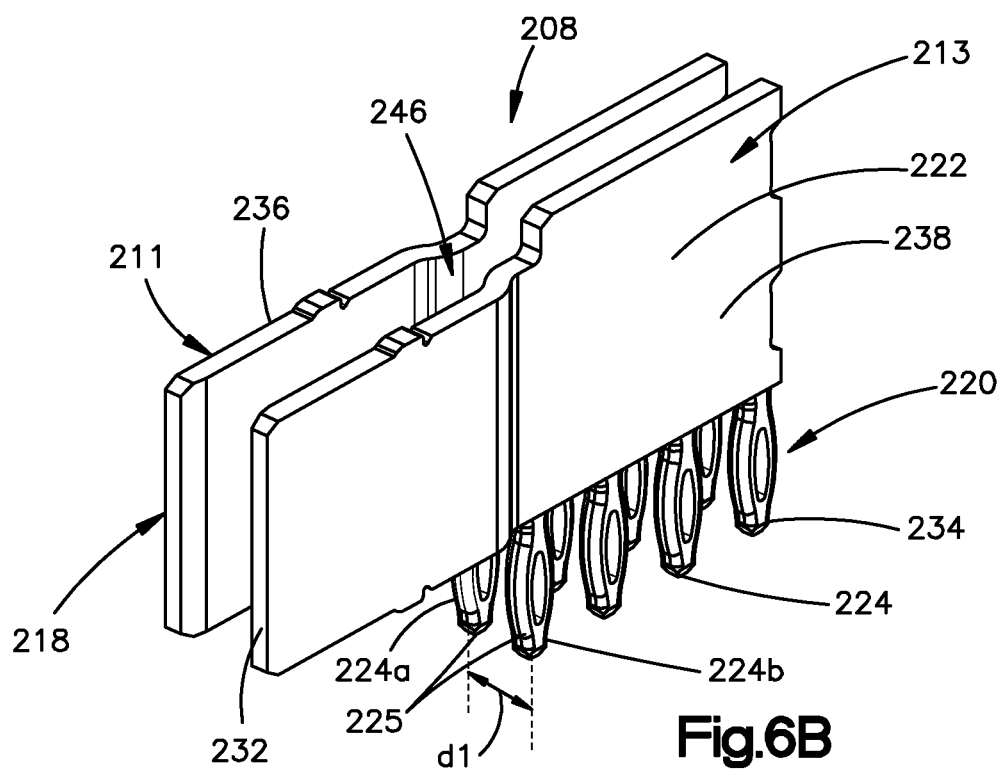
FIG. 6B is a perspective view of a non-bussed power contact that can be included as part of the electrical connector shown in FIG. 3 in accordance with another embodiment.
Figure 7A:
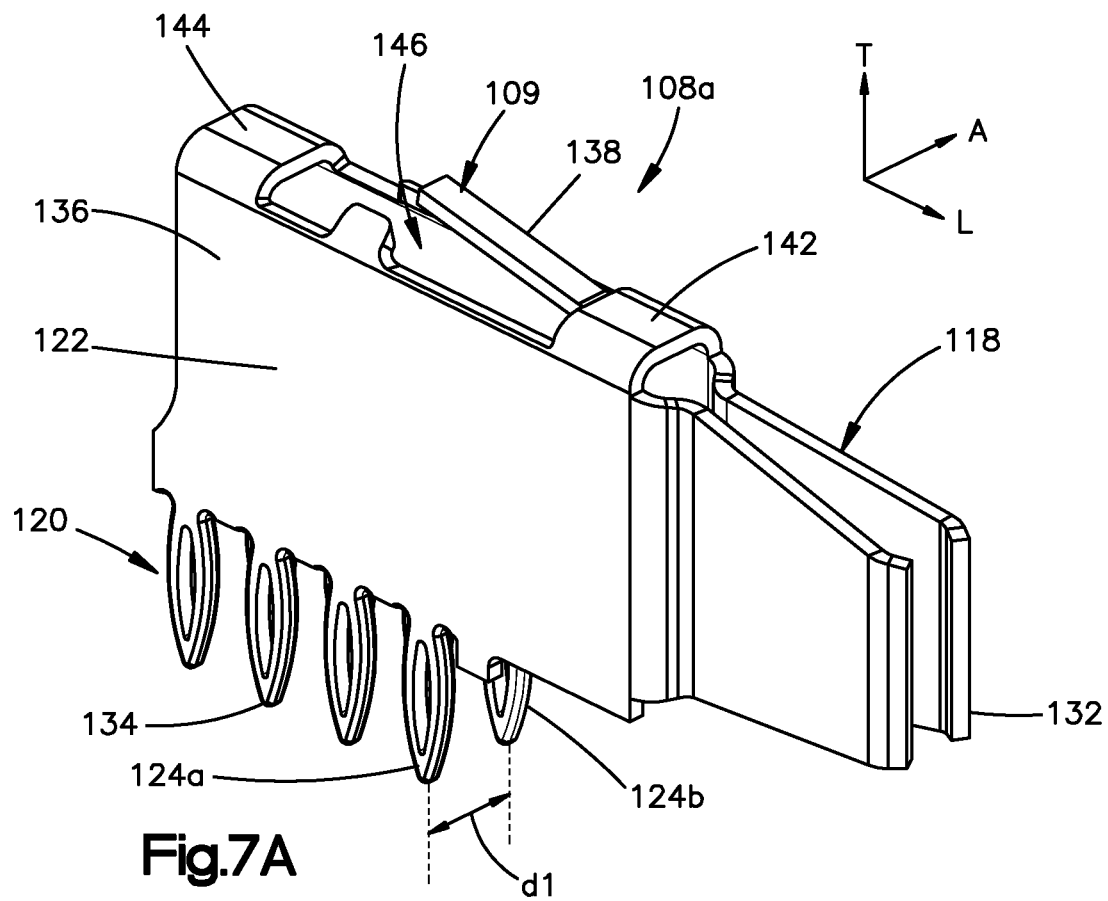
FIG. 7A is a perspective view of another bussed power contact that can be included as part of the electrical connector shown in FIG. 1 in accordance with one embodiment.
Figure 7B:
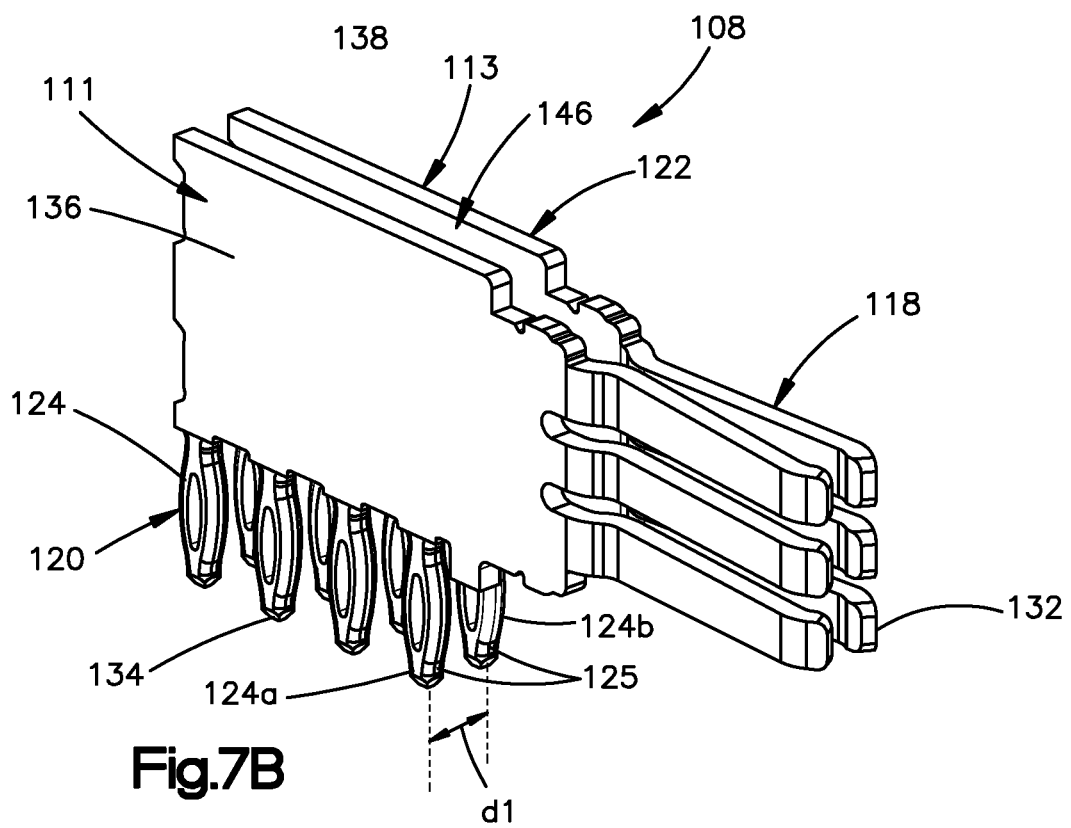
FIG. 7B is a perspective view of the non-bussed power contact that is part of the electrical connector shown in FIG. 3.

Referring to FIGS. 7A-B, the power contact 108 can define a non-bussed power contact, for instance a non-bussed power contact 108 shown in FIG. 7B, or a bussed power contact, for instance a bussed power contact 108a shown in FIG. 7A. Referring also to FIGS. 6A-B, the power contact 208 can define a non-bussed power contact, for instance a non-bussed power contact 208 shown in FIG. 6B, or a bussed power contact, for instance a bussed power contact 208a shown in FIG. 6A. Because the illustrated non-bussed power contact 108 can include two electrically isolated contact bodies, for instance a first contact body 111 and a second contact body 113, the power contact 108 can also be referred to as first and second power contacts 108 that can be supported by the connector housing so as to be spaced from each other along the lateral direction A and electrically isolated from each other by the connector housing 106. Each of the example power contacts 108 and 108a define a mating portion 118, a mounting portion 120, and an intermediate portion 122 that extends between the mating portion 118 and the mounting portion 120. Similarly, because the illustrated non-bussed power contact 208 can include two electrically isolated contact bodies, for instance a first contact body 211 and a second contact body 213, the power contact 208 can also be referred to as first and second power contacts 208 that can be supported by the connector housing 206 so as to be spaced from each other along the lateral direction A and electrically isolated from each other by the connector housing 206. Each of the power contacts 208 and 208a define a mating portion 218, a mounting portion 220, and an intermediate portion 222 that extends between the mating portion 218 and the mounting portion 220. The mating portions 118 are configured to mate with the mating portions 218 of the power contacts 208. The mounting portions 120 and 220 can be configured to electrically connect to the printed circuit boards 104a and 104b. The mounting portions 120 and 220 can include one or more mounting terminals 124 and 224, respectively, that are disclosed proximate to the mounting interfaces 114 and 214, respectively, and are configured to electrically connect to the printed circuit boards 104a and 104b.

In one embodiment, the mounting terminals 124 and 224 can be electrically connected to respective power terminals 127 of the printed circuit boards 104a and 104b. The power terminals 127 of the printed circuit boards 104a and 104b can define mounting locations 128. In accordance with the illustrated embodiment, the power terminals 127 are configured as vias or plated through-holes 126, although it will be understood that the power terminals 127 can be configured as surface mount contacts or otherwise configured as desired. For instance, in accordance with the illustrated embodiment, the mounting terminals 124 and 224 can be inserted into, for instance through, the plated through-holes 126 of the printed circuit boards 104a and 104b. The through-holes 126 can reside at the mounting locations 128 that can define a footprint, for instance a footprint 130 described below with respect to FIGS. 8A-B. Alternatively, at least one up to all of the mounting terminals 124 and 224 can be surface-mounted to the printed circuit boards 104a and 104b. The mounting terminals 124 and 224 can further be soldered to the printed circuit boards 104a and 104b as desired. The power contacts 108 and 108a can be configured as power contacts that transmit electrical power between the printed circuit board and a complementary electrical component, for instance the electrical connector 202. Thus, the electrical connector 102 can be configured as a power connector.

In accordance with the illustrated embodiment, the mating portions 118 and 218 extend forward from the respective intermediate portions 122 and 222 along the longitudinal direction L and terminate at a mating end 132 and 232, respectively. The mounting terminals 124 and 224 can extend downward from the respective intermediate portions 122 and 222 along the transverse direction T and terminate at a mounting end 134 and 234, respectively. Thus, the illustrated mating portions 118 and 218 extend in a direction substantially perpendicular to the mounting terminals 124 and 224 such that the power contacts 108 and 208 can be referred to as right-angle contacts. Alternatively, the power contacts 108 can be constructed as a "vertical" or "mezzanine" arrangement whereby the mating portions 118 and 218 extend in a direction parallel to the mounting terminals 124 and 224, respectively.

Because the illustrated mating ends 232 of the power contacts 208 and 208a are configured to receive the contacts 108 and 108a, they can be referred to as "receptacle" contacts, and the electrical connector 202 can be referred to as a "receptacle" connector.

Referring to FIGS. 6A-B, each of the power contacts 208 and 208a define a first side wall 236 and a second side wall 238 that is spaced from the first side wall 236 along the lateral direction A. As shown in FIG. 6A, the first and second side walls 236 and 238 can be electrically connected by at least one bridge element, for instance a first bridge elements 242 and a second bridge element 244, and thus the illustrated power contact 208a defines a bussed power contact 208a. For instance, the power contact 208a can define a contact body 209 that includes the first and second side walls 236 and 238 respectively. Alternatively, as shown in FIG. 6B, the non-bussed power contact 208 can include the first contact body 211 and the second contact body 213 that is spaced from the first contact body 211 along the lateral direction A such that the contact bodies 211 and 213 are electrically isolated from each other. The first contact body 211 can include the first side wall 236 and the second contact body 213 can include the second side wall 238. A medial space 246, for instance adapted for air flow, can be defined between the first and second side walls 236 and 238, and thus between the first and second contact bodies 211 and 213, respectively. As is clearly shown in FIGS. 6A-B, the distance $d_1$ along the lateral direction A between the side walls 236 and 238 of the bussed power contact 208a, as referenced in FIG. 6A, is greater than the distance $_{d1}$ along the lateral direction A between side walls 236 and 238 of the non-bussed power contact 208, as referenced in FIG. 6B. Also, as is clearly shown in FIG. 6B, the mating portions 218 of the non-bussed power contact 208 are spaced further apart and are wider than the intermediate portions 222 and mounting portions 220. As is shown on page 1 of Appendix B of U.S. Provisional Patent Application Ser. No. 61/870,060, filed Aug. 26, 2013, in some embodiments, the pitch between side walls 236 and 238 of the non-bussed power contact 208 may be 2.54 millimeters.

Figure 4:
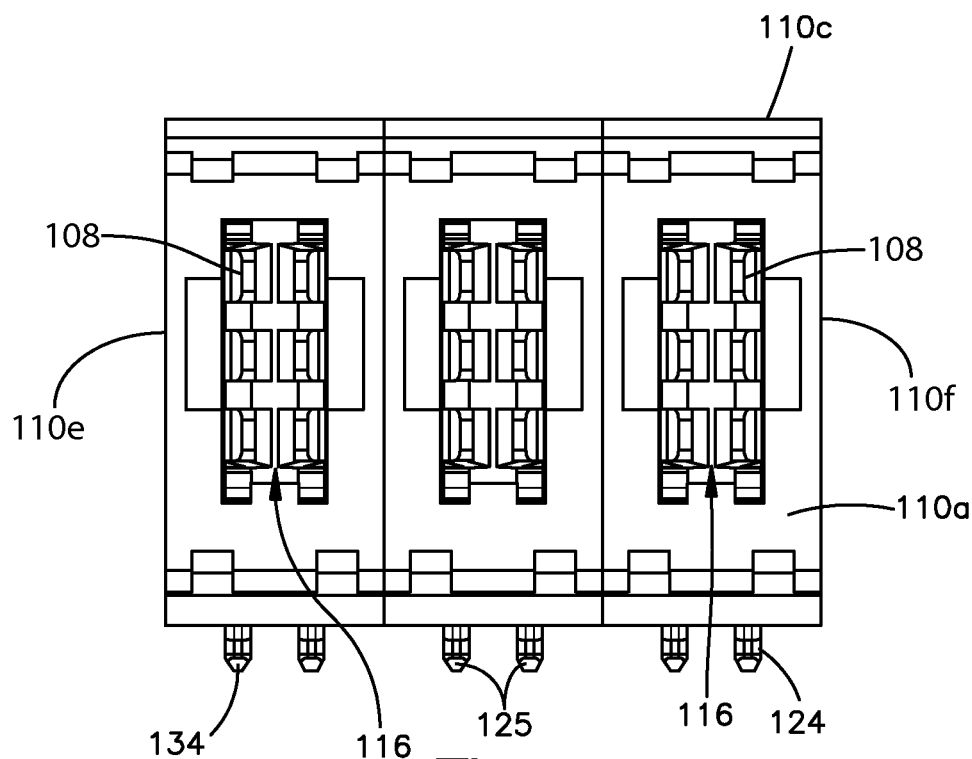
FIG. 4 is a front elevation view of the electrical connector shown in FIG. 1 constructed in accordance with another embodiment.
Figure 5:
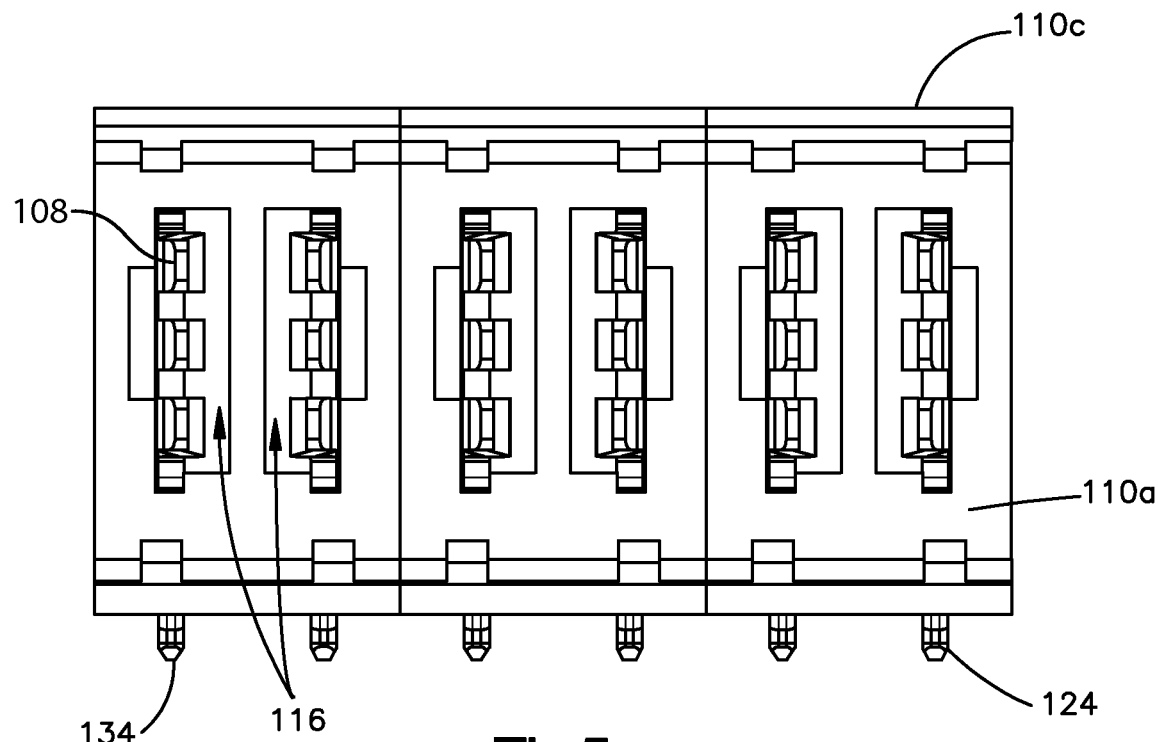
FIG. 5 is a front elevation view of the electrical connector shown in FIG. 1.

Referring to FIGS. 7A-B, each of the power contacts 108 and 108a can include a first side wall 136 and a second side wall 138 that is spaced from the first side wall 136 along the lateral direction A. As shown in FIG. 7A, the first and second side walls 136 and 138 can be electrically connected by one or more upper bridge elements, for instance first and second upper bridge elements 142 and 144, respectively, and thus the power contact 108a can define a bussed power contact 108a. For instance, the power contact 108a can define a contact body 109 that includes the first and second side walls 136 and 138 respectively. Alternatively, as shown in FIG. 7B, the non-bussed power contact 108 can include the first contact body 111 and the second contact body 113 that is spaced from the first contact body 111 along the lateral direction A such that the contact bodies 111 and 113 are electrically isolated from each other. The first contact body 111 can include the first side wall 136 and the second contact body 113 can include the second side wall 138. A medial space 146, for instance adapted for air flow, can be defined between the first and second side walls 136 and 138, and thus between the first and second contact bodies 111 and 113, respectively. As is clearly shown in FIGS. 7A-B, the distance $d_1$ along the lateral direction A between the side walls 136 and 138 of the bussed power contact 108a, as referenced in FIG. 7A, is greater than the distance $d_1$ along the lateral direction A between side walls 136 and 138 of the non-bussed power contact 108, as referenced in FIG. 7B. Also, as is shown in FIG. 4, the mating portion 188, including the mating ends 132, of the non-bussed power contact 108 is narrower than the intermediate portions 122 and mounting portions 120. As is shown on page 1 of Appendix B of U.S. Provisional Patent Application Ser. No. 61/870,060, filed Aug. 26, 2013, in some embodiments, the pitch between side walls 136 and 138 of the non-bussed power contact 108 may be 2.54 millimeters.

The mounting portion 120 of each of the power contacts 108 and 108a can include at least one pair 125 of mounting terminals 124. The mounting terminals 124 in each pair 125 can be aligned with each along the longitudinal direction L, and spaced from each other along the lateral direction A to define a first distance $d_1$. It will be understood that distances between mounting terminals, and in particular between power terminals, can be referred to as a pitch, and the pitch can vary as desired. For instance, the pitch can be sized so that the mounting terminals 124 can establish an electrical connection with various printed circuit boards, for instance the bussed printed circuit board 104a and the non-bussed printed circuit board 104b. Thus, each pair 125 of mounting terminals 124 can include a first mounting terminal 124a and a second mounting terminal 124b that is spaced from the first mounting terminal 124a the first distance $d_1$. The mounting terminals 124 can define through-hole, solder-to-board pins, press fit pins (as shown in FIGS. 7A-B) or surface mount tails, or any suitable alternative structure configured to electrically connect to the printed circuit boards 104a and 104b, and in particular to the power terminals 127.

The mounting portion 220 of each power contact 208 and 208a can include at least one pair 225 of mounting terminals 224. The mounting terminals 224 in each pair 225 are aligned with each along the longitudinal direction L, and spaced from each other the first distance $d_1$ as measured along the lateral direction A. Each pair 225 of the mounting terminals 224 can include a first mounting terminal 224a and a second mounting terminal 224b that is spaced from the first mounting terminal 224a so as to define the first distance $d_1$. The mounting terminals 224 can define through-hole, solder-to-board pins, press fit pins (as shown in FIGS. 6A-B) or surface mount tails, or any suitable alternative structure configured to electrically connect to the printed circuit boards 104a and 104b.

It will be understood that the power contacts 108, 208a, 208, and 208a can be stamped or otherwise formed as a single piece from a strip of suitable contact materials such as phosphor bronze alloys, beryllium copper alloys, or any suitable alternative electrically conductive material.

Figure 8A:
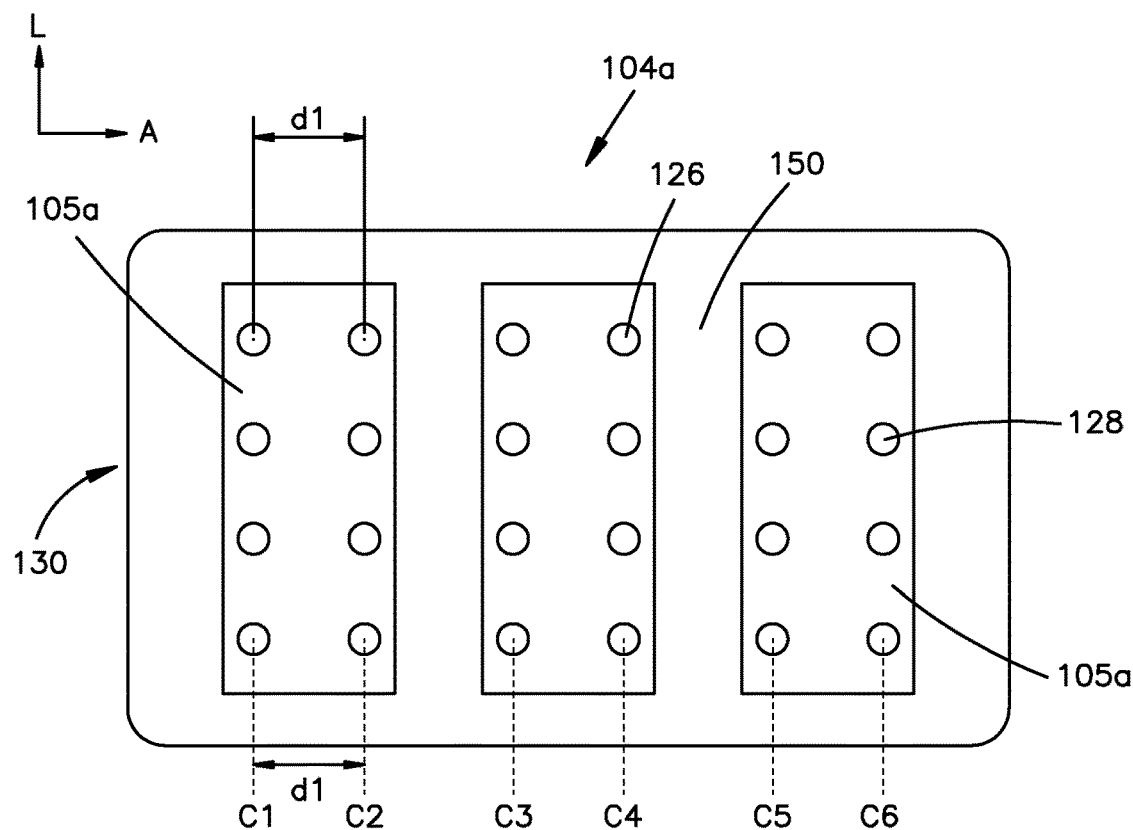
FIG. 8A is a top plan view of a bussed printed circuit board that includes columns of through holes that are bussed together, wherein the bussed printed circuit board is configured to receive portions of the electrical connectors shown in FIGS. 1 and 3.
Figure 8B:
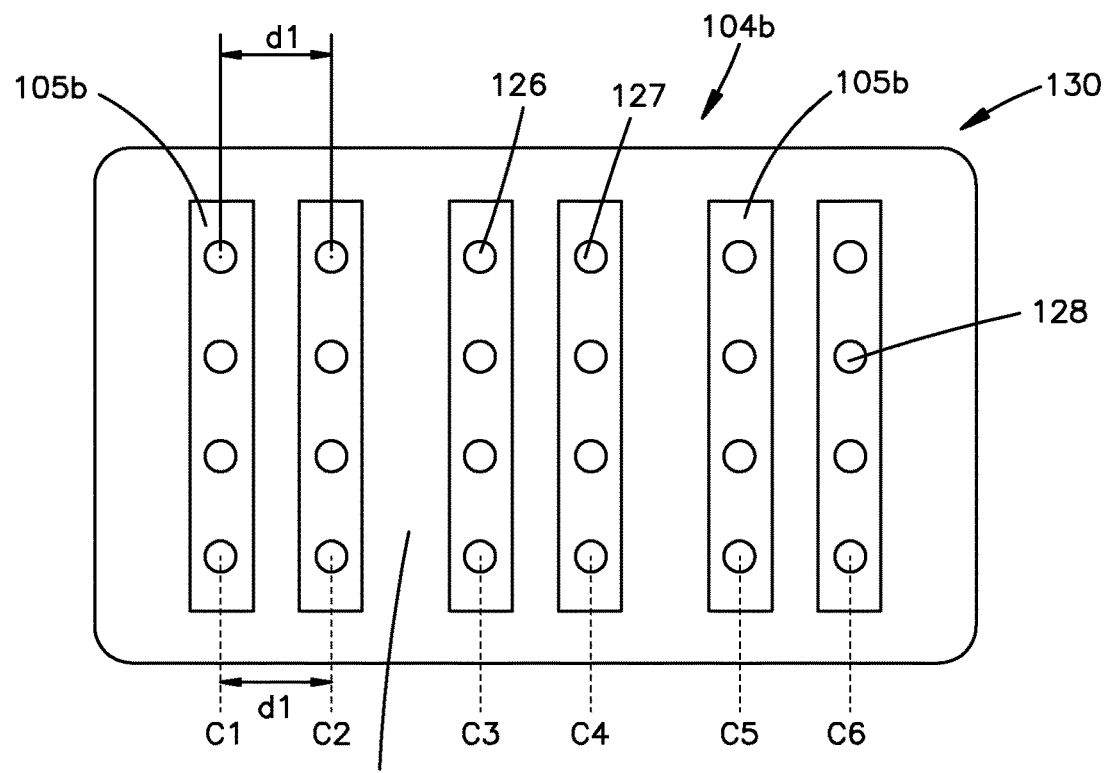
FIG. 8B is a top plan view of a non-bussed printed circuit board that includes columns of through holes that are not bussed together, wherein the non-bussed printed circuit board is configured to receive portions of the electrical connectors shown in FIGS. 1 and 3.

Referring to FIG. 8A-B, the printed circuit boards 104a and 104b can include a plurality of mounting locations 128, which can be provided as plated through holes 126. The plated through holes 126 can be configured to receive the mounting terminals 124 and 224 of the power contacts as described above. The mounting terminals can define any geometrical cross-sectional shape as desired.

The mounting terminals 124 and 224 of the power contacts defines the footprint 130 that can be taken from a portion of a bottom plan view of the electrical connectors 102 and 202. Referring to FIGS. 8A-B, the illustrated footprint 130 is illustrated as including through holes for three power contacts, though any number of through holes can be provided as desired so as to receive any number power contacts as desired. The mounting terminals 124 of the power contacts are arranged in a plurality of columns. For instance, the first mounting terminals 124a of each power contact 108 are arranged in a first column (column 1) of the respective contact, and the second mounting terminals 124b of each power contact 108 are arranged in a second column (column 2) of the respective contact. Columns 1 and 2 of each power contact 108 are disposed laterally adjacent each other and extend along a direction, for instance the longitudinal direction L, that is substantially parallel to each other. The power contacts are further arranged such that the first column ($C_1$) of one power contact is disposed laterally adjacent to the second column ($C_2$) of its adjacent power contact.

Similarly, each of the printed circuit boards 104a and 104b define the footprint 130. The through holes are arranged in a plurality of columns. For instance, adjacent columns C1 and C2 are spaced apart the first distance d1 along the lateral direction A. Thus, the mounting terminals 124 and 224 are aligned and can be received at the mounting locations 128 of the printed circuit boards 104a and 104b. In particular, the columns can define a centerline disposed at the midpoint between the columns along the lateral direction A. The spacing between the centerlines of adjacent column midpoints may be substantially equal to the spacing between the mounting terminals 124 in each pair 125 along the lateral direction A.

The printed circuit board 104a and the printed circuit board 104b define the same footprint 130 such that the printed circuit boards 104a and 104b can be used interchangeably with the electrical connectors 102 and 202, which can be defined as being substantially similar with respect to each other. The printed circuit board 104a includes an electrically insulative substrate 150 and common bussed electrically conductive power pads 105a that are attached to the substrate 150 and electrically connect two columns of mounting locations with each other.

For instance, the bussed power pads 105a can be configured such that the power terminals 127 in the first column ($C_1$), are electrically connected with the power terminals 127 in the second column ($C_2$), the power terminals 127 in a third column ($C_3$), are electrically connected with the power terminals 127 in a fourth column ($C_4$), and the power terminals 127 in a fifth column ($C_5$), are electrically connected with the power terminals 127 in a sixth column ($C_6$). Thus, the non-bussed power contacts 108 and 208 can become "bussed" when they are mounted to the printed circuit board 104a. For instance, the first mounting terminal 124a and the second mounting terminal 124b in each pair 125 are electrically connected when the electrical connector 102 including the non-bussed power contact 108 is mounted to the printed circuit board 104a. Similarly, the first mounting terminal 224a and the second mounting terminal 224b in each pair 225 are electrically connected when the electrical connector 202 including the non-bussed power contact 208 is mounted to the printed circuit board 104a. Thus, the first contact bodies 111 and 211 are electrically connected to the second contact bodies 113 and 213, respectively, when the power contacts 108 and 208 are mounted to the printed circuit board 104a. As illustrated, there is one bussed power pad 105a per two columns, although it will be understood that the number of bussed power pads 105a can vary as desired. It will further be understood that the printed circuit board 104a can include any number of columns as desired.

Alternatively, the printed circuit board 104b includes electrically conductive non-bussed or discreet electrically conductive power pads 105b such that the power terminals 127 in different columns are not electrically connected with each other. The non-bussed power pads 105b electrically connect power terminals 127 that reside in the same column as each other. As illustrated, there is one non-bussed power pad 105b per column, although it will be understood that the number of non-bussed power pads 105b can vary as desired. Thus, as illustrated, the power terminals 127 that reside in the first column $C_1$ are electrically connected to each other, the power terminals 127 that reside in the second column $C_2$ are electrically connected to each other, the power terminals 127 that reside in the third column $C_3$ are electrically connected to each other, the power terminals 127 that reside in the fourth column $C_4$ are electrically connected to each other, the power terminals 127 that reside in the fifth column $C_5$ are electrically connected to each other, and the power terminals 127 that reside in the sixth column $C_6$ are electrically connected to each other.

Thus, the electrical connector 102 can be mounted to the printed circuit 104a to obtain electrical properties that are different than electrical properties that are obtained when the electrical connector 102 is mounted to the printed circuit board 104b. For instance, the first and second power contacts 108 of the electrical connector 102 can each carry at least 45 amps to approximately 100 amps, at approximately 200 volts (V) DC, and at a 30 degrees Celsius (C) temperature rise, when the electrical connector 102 is mounted to the printed circuit board 104a so as to establish an electrical connection between the electrical connector 102 and the bussed power pads 105a, and thus between the first and second power contacts 108. Stated another way, each of the first and second power contacts 108 can carry 48, 51, 54, 57, 60, 63, 66, 69, 71, 74, 77, 80, 83, 86, 89, 91, 94, or 97 amps, wherein each of the aforementioned values can vary by at least plus or minus five percent. Further, each of the electrically isolated power contacts 108 of the electrical connector can carry at least 25 amps, for instance 25 amps to approximately 75 amps, at approximately 200 VDC, and at a 30 degrees C. temperature rise, when the electrical connector 102 is mounted to the printed circuit board 104b so as to establish an electrical connection between the first and second power contacts 108 and the non-bussed power pads 105b. Stated another way, each of the electrically isolated power contacts 108 can carry 28, 31, 34, 37, 40, 43, 46, 49, 51, 54, 57, 60, 63, 66, 69, 71 or 74 amps, wherein each of the aforementioned values can vary by at least plus or minus five percent. In one example embodiment, the first and second power contacts 108 can carry approximately 87 amps at 200V/30 degree C. temperature rise when the electrical connector 102 is electrically connected to the bussed power pads 105a, and the electrically isolated power contacts 108 can carry approximately 60 amps at 200V/30 degrees C. temperature rise when the electrical connector 102 is electrically connected to the non-bussed power pads 105b. Thus, the electrical connector 102 can be configured to obtain a first carrying capacity and a second carrying capacity that is lower than the first current carrying capacity. The current carrying capacity of an electrical contact can refer to an amount of current that the electrical contact can carry without melting, overheating, or otherwise degrading. Stated another way, it will be appreciated that the current carrying capacity of an electrical connector can refer to an amount of current that is appropriate for the electrical connector to carry.

Further, it will be understood that ones of the power contacts 108 and 208, for instance every other contact along the lateral direction A, can be removed from respective electrical connectors 102 and 202 such that the electrical connectors can be mounted to the bussed printed circuit board 104a to define an electrical connector assembly that exhibits substantially similar electrical properties to an electrical connector assembly in which the electrical connector includes all its power contacts 108 and is mounted to the non-bussed printed circuit board 104b. For instance, FIG. 3 shows the electrical connector 202 with the power contacts 208 disposed in every other opening 216 along the lateral direction A. Thus, the electrical connectors described herein can be modified by removing electrical contacts. In an example embodiment, a modified electrical connector can obtain a higher power level than an unmodified electrical connector. For instance, the electrical connector 202 can be configured, for instance by removing electrical contacts, to provide power at 400 VDC. It will be understood that various electrical connectors described herein can be substantially identical to each other such that they can be mounted to printed circuit boards having the same footprint. For instance, substantially identical electrical connectors can include the same connector housing in accordance with an example embodiment. Further, substantially identical electrical connectors can conform to the same manufacturing tolerances, while also providing different electrical effects when they are mounted to a printed circuit board.

It will be understood that the electrically conductive power pads 105*a* and 105*b* can be stamped or otherwise formed as a single piece from a strip of suitable contact materials such as phosphor bronze alloys, beryllium copper alloys, or any suitable alternative electrically conductive material.

In accordance with an example embodiment and in accordance with the description above, a method of power usage, which can also be referred to as a method of power regulation, can include selecting a first electrical connector having an electrically insulative first connector housing and first and second power contacts supported by the first connector housing, wherein each of the first and second power contacts are configured to electrically connect to a common bussed electrically conductive power pad of a printed circuit board so as to place the first and second power contacts in electrical communication with each other and thereby obtain a first current capacity and a first voltage capacity. The method can further include selecting a second electrical connector that is substantially identical to the first electrical connector, the second electrical connector having an electrically insulative second connector housing and first and second power contacts supported by the second connector housing, wherein each of the first and second power contacts of the second electrical connector are configured to electrically connect to respective non-bussed electrically conductive power pads of a printed circuit board to obtain a second current carrying capacity that is lower than the first current carrying capacity. The method can further include mounting the first power contact of the first electrical connector to a first column of electrically conductive mounting locations of the common bussed electrically conductive power pad, and mounting the second power contact of the first electrical connector to a second column of electrically conductive mounting locations of the common bussed electrically conductive power pad, so as to place the first and second power contacts in electrical communication with each other across the common bussed power bad. For instance, press-fit mounting tails of the first and second power contacts of the first electrical connector can be inserted into respective ones of first and second columns of vias that extend at least into the common bussed electrically conductive power pad. The method can further include carrying approximately 45 to 100 amps, for instance approximately 87 amps, of electrical current through the first and second power contacts of the first electrical connector, and carrying approximately 25 to 75 amps, for instance approximately 60 amps, of electrical current through each of the first and second power contacts of the second electrical connector.

In accordance with another example embodiment and in accordance with the description above, another method of power usage or power regulation can include selecting an electrical connector having an electrically insulative first connector housing and first and second power contacts that are supported by the first connector housing so as to be spaced from each other and electrically isolated from each other by the first connector housing; and establishing an electrical connection between each of the first and second power contacts and one of 1) bussed power terminals of a printed circuit board so as to place the first and second power contacts in electrical communication with each other and thereby obtain a first current capacity and a first voltage capacity, and 2) respective first and second columns of power terminals of a printed circuit board, the first column of power terminals electrically isolated from the second column of power terminals, to obtain a second current carrying capacity that is lower than the first current carrying capacity.

Further, the first and second power contacts can be mounted into vias of the first and second columns of the power terminals, respectively, wherein each of the power terminals of the first column can bussed together, and each of the power terminals of the second columns can be bussed together. Thus, a first electrically conductive contact pad can support the first column of power terminals, and a second electrically conductive contact pad can support the second column of power terminals. The first and second electrically conductive contact pads can be electrically isolated from each other. Further, the bussed power terminals can be supported by a common bussed electrically conductive power pad of the printed circuit board. The method of power regulation can include the step of mounting press-fit terminals of each of the first and second power contacts into vias that extend at least into the common bussed power pad. It will be understood that the printed circuit board having the bussed power terminals and the printed circuit board having the isolated columns of terminals can define the same printed circuit board. Alternatively, the printed circuit board having the bussed power terminals and the printed circuit board having the isolated columns of terminals can be different printed circuit boards.

A method of manufacturing a printed circuit board, for instance the printed circuit boards 104*a* and 104*b*, in accordance with one embodiment, can include considering bussed electrically conductive power pads that define first and second columns of power terminals on an electrically insulative substrate of the printed circuit board to provide a first current capacity and a first voltage capacity; and considering first and second columns of power terminals that are electrically isolated from each other by the electrically insulative substrate to provide a second current capacity that is less than the first current capacity and the first voltage capacity. The method can further include supporting one of the bussed power pads and the electrically isolated first and second columns of power terminals on the electrically insulative substrate. Thus, the method of manufacturing a printed circuit board, for instance the printed circuit boards 104*a* and 104*b*, can include selecting from 1) bussed electrically conductive power pads that define first and second columns of power terminals on an electrically insulative substrate of the printed circuit board to provide a first current capacity and a first voltage capacity, and 2) first and second columns of power terminals that are electrically isolated from each other by the electrically insulative printed circuit board to provide a second current capacity that is less than the first current capacity and the first voltage capacity. After the selecting step, the method can further include supporting one of the bussed power pads and the electrically isolated first and second columns of power terminals on the electrically insulative substrate. The columns of bussed power terminals can be spaced apart a first distance, and the columns of electrically isolated power terminals can be spaced apart a second distance that is equal to the first distance. The bussed power terminals and the electrically isolated power terminals can be plated through holes configured to receive press-fit tails. Alternatively, the bussed power terminals and the electrically isolated power terminals can be configured to electrically connect to surface mount contacts. The electrically isolated power terminals of the first column can be bussed together via a first power pad of the printed circuit board, and the electrically isolated power terminals of the second column can be bussed together via a second power pad of the printed circuit board.

In accordance with yet another embodiment and in accordance with the description above, a method of power usage, which can also be referred to as a method of power regulation, can include offering for sale a first electrical connector that includes an electrically insulative first connector housing and first and second power contacts supported by the connector housing, the first and second power contacts defining first and second parallel columns, respectively, of mounting terminals that are each configured to be electrically connected to a bussed power pad of a printed circuit board. The bussed power pad can include first and second parallel columns of through holes that are configured to receive the first and second parallel columns of mounting terminals. The method can further include offering for sale a second electrical connector that is a drop-in replacement for the first electrical connector. The second electrical connector can include an electrically insulative second connector housing and a power contact supported by the connector housing. The power contact can define a column of mounting terminals such that one of the first and second columns of through holes do not receive terminals when the second electrical connector is mounted to the printed circuit board.

In accordance with yet another embodiment, an electrical connector family includes a plurality of related electrical connectors. Thus, the electrical connector family can include the first electrical connector that comprises an electrically insulative first connector housing and a power contact or contacts supported by the connector housing. The power contact or contacts can define first and second parallel columns of mounting terminals that are each configured to be electrically connected to a bussed power pad of a printed circuit board. The bussed power pad can include first and second parallel columns of through holes that are configured to receive the first and second parallel columns of mounting terminals. The electrical connector family can further include a second electrical connector that is a drop-in replacement for the first electrical connector. The second electrical connector can include an electrically insulative second connector housing and a power contact supported by the second connector housing. The power contact can define a column of mounting terminals such that one of the first and second columns of through holes do not receive terminals when the second electrical connector is mounted to the printed circuit board. The mounting terminals of the first connector have the same pitch as the mounting terminals of the second connector.

Further, the press-fit mounting tails of the first and second power contacts of the first electrical connector can be spaced from each other the same distance as press-fit mounting tails of the first and second power contacts of the second electrical connector. Thus, the first and second power contacts of the first electrical connector can be spaced from each other a first distance, and the first and second power contacts of the second electrical connector can be spaced from each other a second distance that is equal to the first distance.

The embodiments described in connection with the illustrated embodiments have been presented by way of illustration, and the present invention is therefore not intended to be limited to the disclosed embodiments. Furthermore, the structure and features of each the embodiments described above can be applied to the other embodiments described herein, unless otherwise indicated. Accordingly, the invention is intended to encompass all modifications and alternative arrangements included within the spirit and scope of the invention, for instance as set forth by the appended claims.

What is claimed:

1. An electrical assembly including electrical connectors in an electrical connector family comprising a plurality of related electrical connectors, the electrical assembly comprising:
    a printed circuit board comprising at least one bussed power pad and at least one non bussed power pad, the bussed power pad comprising first and second parallel columns of through holes that are configured to receive a first and second column of mounting terminals, wherein the through holes in the first column are electrically connected to the second column, and the non bussed power pad comprising a third column of through holes;
    a first electrical connector comprising:
        a plurality of first electrically insulative connector housings attached to each other, each of the plurality of first electrically insulative connector housings including openings to support one or more contact bodies of a power contact, the plurality of electrically insulative connector housings including a first connector housing, the first connector housing including a first opening, a second opening, and a first power contact supported by the first connector housing, the first power contact including a first contact body and a second contact body, each of the first opening and second opening including a set of opposed sides,
        wherein 1) the first and second contact bodies are, within the first connector housing, electrically isolated, 2) the first and second contact bodies are separated by a medial space, 3) the first and second contact bodies each include a mating portion, a mounting portion and an intermediate portion connected to the mating portion and the mounting portion, the mating portion extending forward from the intermediate portion along a longitudinal direction, wherein the mounting portion of the first contact body includes the first column of mounting terminals, and the mounting portion of the second contact body includes the second column of mounting terminals thereby defining first and second parallel columns of mounting terminals that are electrically connected to the bussed power pad of the printed circuit board, 4) the first contact body is disposed in the first opening positioned along a first side of the set of opposed sides of the first opening, and 5) the second contact body is disposed in the second opening positioned along a second side of the set of opposed sides of the second opening; and
    a second electrical connector that is a drop-in replacement for the first electrical connector mounted to the printed circuit board, the second electrical connector including a plurality of second electrically insulative connector housings attached to each other, the plurality of second electrically insulative connector housings including a second connector housing comprising a location configured to receive the first contact body and a location configured to receive the second contact body, and a second power contact supported by the second connector housing, the second power contact comprising a third contact body shaped like the first contact body, wherein:
the third contact body defines a third column of mounting terminals and is disposed in the location configured to receive the first contact body, and
the location configured to receive the second contact body in the second electrical connector is devoid of a contact body and a parallel column of through holes receives the third column of mounting terminals of the third contact body.

2. The electrical assembly as recited in claim 1, wherein the mounting terminals of the first electrical connector have a same pitch as the mounting terminals of the second electrical connector.

3. An electrical assembly comprising:
an electrical connector comprising:
a dielectric connector housing including a housing body that defines a mounting interface configured to be mounted facing a substrate and a mating interface configured to mate with at least one complementary electrical connector along a mating direction;
a plurality of electrical power contacts supported by the connector housing and spaced apart from each other along a lateral direction that is substantially perpendicular to the mating direction, the plurality of electrical power contacts each having at least one contact body, the contact body including 1) a mating portion comprising a blade portion configured to mate with a complementary electrical contact of the at least one complementary electrical connector when the connector housing is mated with the at least one complementary electrical connector, the mating portion comprising a first end and a second end opposite the first end, the second end defining a mating end, 2) a mounting portion configured to electrically connect to the substrate when the connector housing is mounted facing the substrate, 3) an intermediate portion connected to the mating portion and the mounting portion, and 4) a bend along an axis transverse to a longitudinal axis of the contact body separating the blade portion and the intermediate portion,
wherein 1) the mounting portion and the intermediate portion are located in a same plane, 2) the bend in the contact body places the blade portion in an outer plane and the intermediate portion in an inner plane parallel to the outer plane, 3) the blade portion has a planar configuration from the first end to the second end, and 4) the bend extends forward from the intermediate portion in a longitudinal direction and is arranged between an end of the intermediate portion and the first end of the mating portion.

4. The electrical assembly of claim 3, wherein the housing body, when mounted on the substrate comprises a height from the substrate of less than 10 millimeters.

5. The electrical assembly of claim 3, further comprising at least one pair of receptacle openings, each receptacle opening having one contact body of a power contact, wherein the contact bodies of the pair of receptacle openings are mirror images of each other in relation to a center line between the receptacle openings.

6. The electrical assembly of claim 5, further comprising at least two pairs of receptacle openings, wherein a distance between center lines defined by each pair of receptacle openings is 7 millimeters.

7. The electrical assembly of claim 3, further comprising:
a printed circuit board having a common bussed electrically conductive power pad, the power pad including first and second columns of electrically conductive mounting locations,
wherein the plurality of power contacts comprises a first power contact comprising a first contact body, and
wherein 1) the mounting portion of the first contact body is inserted into the first column of mounting locations, 2) no contact body is inserted into the second column of mounting locations, and 3) the combination of electrical connector and printed circuit board is capable of carrying 400 volts of direct current electricity while maintaining a temperature rise of less than 30 degrees Centigrade.

8. The electrical assembly of claim 3, further comprising:
a plurality of receptacle openings each containing a first contact body and a second contact body of a power contact,
wherein 1) the first and second contact bodies are, within the connector housing, electrically isolated, 2) the first and second contact bodies are separated by a medial space, 3) the first and second contact bodies include first and second bends, respectively, and 4) the first and second bends in the first and second contact bodies are positioned so that the mating portions of the first and second contact bodies are separated by a wider distance than the intermediate portions of the first and second contact bodies.

9. The electrical assembly of claim 8, wherein the mounting portions of the first and second contact bodies are 2.54 millimeters apart.

10. The electrical assembly of claim 8, wherein the housing body, when mounted on the substrate comprises a height from the substrate of less than 10 millimeters.

11. The electrical assembly of claim 8, further comprising:
a printed circuit board having a common bussed electrically conductive power pad, the power pad including first and second columns of electrically conductive mounting locations,
wherein 1) the mounting portion of the first contact body is inserted into the first column of mounting locations and 2) the mounting portion of the second contact body is inserted into the second column of mounting locations so as to place the first and second contact bodies in electrical communication with each other across the common bussed electrically conductive power pad.

12. The electrical assembly of claim 11, wherein the combination of electrical connector and printed circuit board is capable of carrying 87 amps, plus or minus five percent, of 200 volt direct current electricity while maintaining a temperature rise of less than 30 degrees Centigrade.

13. The electrical assembly of claim 8, further comprising:
a printed circuit board having first and second columns of electrically conductive mounting locations,
wherein 1) the mounting portion of the first contact body is inserted into the first column of mounting locations and 2) the mounting portion of the second contact body is inserted into the second column of mounting locations.

14. The electrical assembly of claim 13, wherein the combination of electrical connector and printed circuit board is capable of carrying 60 amps, plus or minus five percent, of 200 volt direct current electricity while maintaining a temperature rise of less than 30 degrees Centigrade.

15. The electrical assembly of claim 3, further comprising:
the at least one complimentary electrical connector comprising:
an electrically insulative connector housing including a housing body that defines a front end, a rear end opposite the front end along the longitudinal direction, a top end that extends from the front end to the rear end, and a bottom end spaced from the top end along a transverse direction that is perpendicular with respect to the longitudinal direction, the bottom end defining a mounting interface that is configured to be mounted onto the substrate;
a plurality of power contacts supported by the connector housing and spaced apart from each other along the lateral direction that is substantially perpendicular to the mating direction, the power contacts having at least one contact body, the contact body including 1) a mating portion configured to mate with an electrical contact of the electrical connector when the connector housing is mated with the electrical connector, the mating portion terminating in a mating end, 2) a mounting portion configured to electrically connect to the substrate when the connector housing is mounted onto the substrate, 3) an intermediate portion connected to the mating portion and the mounting portion, and 4) a bend along an axis transverse to the longitudinal axis of the contact body separating the mating portion and the intermediate portion,
wherein 1) the mounting portion and the intermediate portion are located in a same plane, 2) the bend in the contact body places at least a portion of the mating end inside of a region bounded by planes defined by either side of the intermediate portion, 3) the mating portion includes three contact fingers extending from an outward portion of the bend and terminating at the mating end, and 4) an inward portion of the bend extends from the intermediate portion in the longitudinal direction and terminates at the outward portion of the bend.

16. An electrical assembly comprising an electrical connector configured to mate with at least one complementary electrical connector, and further configured to mount to a substrate along a mounting direction, the electrical connector comprising:
an electrically insulative connector housing including a housing body that defines a front end, a rear end opposite the front end along a longitudinal direction, a top end that extends from the front end to the rear end, and a bottom end spaced from the top end along a transverse direction that is perpendicular with respect to the longitudinal direction, the bottom end defining a mounting interface that is configured to be mounted onto the substrate;
a plurality of power contacts supported by the connector housing and spaced apart from each other along a lateral direction that is substantially perpendicular to a mating direction, each of the plurality of power contacts having at least one contact body, the contact body including 1) a mating portion configured to mate with a complementary electrical contact of the at least one complementary electrical connector when the connector housing is mated with the at least one complementary electrical connector, the mating portion terminating in a mating end, 2) a mounting portion configured to electrically connect to the substrate when the connector housing is mounted onto the substrate, 3) an intermediate portion connected to the mating portion and the mounting portion, and 4) a bend along an axis transverse to a longitudinal axis of the contact body separating the mating portion and the intermediate portion,
wherein 1) the mounting portion and the intermediate portion are located in a same plane, 2) the bend in the contact body places at least a portion of the mating end inside of a region bounded by planes defined by either side of the intermediate portion, 3) the mating portion includes three contact fingers extending from an outward portion of the bend and terminating at the mating end, and 4) an inward portion of the bend extends from the intermediate portion in the longitudinal direction and terminates at the outward portion of the bend.

17. The electrical assembly of claim 16, wherein the housing body, when mounted on the substrate comprises a height from the substrate of less than 10 millimeters.

18. The electrical assembly of claim 16, further comprising at least one pair of header contacts, each header contact comprising one contact body, wherein the contact bodies of the pair of header contacts are mirror images of each other in relation to a center line between the header contacts.

19. The electrical assembly of claim 18, further comprising at least two pairs of header contacts, wherein a distance between center lines defined by each pair of header contacts is 7 millimeters.

20. The electrical assembly of claim 16, further comprising:
a printed circuit board having a common bussed electrically conductive power pad, the power pad including first and second columns of electrically conductive mounting locations,
wherein the plurality of power contacts comprises a first power contact comprising a first contact body, and
wherein 1) the mounting portion of the first contact body is inserted into the first column of mounting locations, 2) no contact body is inserted into the second column of mounting locations, and 3) the combination of electrical connector and printed circuit board is capable of carrying 400 volts of direct current electricity while maintaining a temperature rise of less than 30 degrees Centigrade.

21. The electrical assembly of claim 16, further comprising:
a plurality of header contacts each containing a first contact body and a second contact body,
wherein 1) the first and second contact bodies are, within the connector housing, electrically isolated, 2) the first and second contact bodies are separated by a medial space, 3) the first and second contact bodies include first and second bends, respectively, and 4) the first and second bends in the first and second contact bodies are positioned so that, in relation to the medial space, the mating portions of the first and second contact bodies are separated by a narrower distance than the intermediate portions of the first and second contact bodies.

22. The electrical assembly of claim 21, wherein the mounting portions of the first and second contact bodies are 2.54 millimeters apart.

23. The electrical assembly of claim 21, wherein the housing body, when mounted on the substrate comprises a height from the substrate of less than 10 millimeters.

24. The electrical assembly of claim 21, further comprising:
- a printed circuit board having a common bussed electrically conductive power pad, the power pad including first and second columns of electrically conductive mounting locations,
- wherein 1) the mounting portion of the first contact body is inserted into the first column of mounting locations and 2) the mounting portion of the second contact body is inserted into the second column of mounting locations so as to place the first and second contact bodies in electrical communication with each other across the common bussed electrically conductive power pad.

25. The electrical assembly of claim 24, wherein the combination of electrical connector and printed circuit board is capable of carrying 87 amps, plus or minus five percent, of 200 volt direct current electricity while maintaining a temperature rise of less than 30 degrees Centigrade.

26. The electrical assembly of claim 21, further comprising:
- a printed circuit board having first and second columns of electrically conductive mounting locations,
- wherein 1) the mounting portion of the first contact body is inserted into the first column of mounting locations and 2) the mounting portion of the second contact body is inserted into the second column of mounting locations.

27. The electrical assembly of claim 26, wherein the combination of electrical connector and printed circuit board is capable of carrying 60 amps, plus or minus five percent, of 200 volt direct current electricity while maintaining a temperature rise of less than 30 degrees Centigrade.

* * * * *